US012604530B2

(12) United States Patent
Kim et al.

(10) Patent No.: US 12,604,530 B2
(45) Date of Patent: Apr. 14, 2026

(54) DISPLAY DEVICE AND METHOD FOR MANUFACTURING THE SAME

(71) Applicant: LG Display Co., Ltd., Seoul (KR)

(72) Inventors: Da-Young Kim, Paju-si (KR);
Won-Gyu Jeong, Paju-si (KR);
Joong-Ha Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 391 days.

(21) Appl. No.: 18/471,880

(22) Filed: Sep. 21, 2023

(65) Prior Publication Data

US 2024/0128280 A1 Apr. 18, 2024

(30) Foreign Application Priority Data

Oct. 17, 2022 (KR) ........................ 10-2022-0133480

(51) Int. Cl.
| | |
|---|---|
| *H10D 86/60* | (2025.01) |
| *H01L 25/16* | (2023.01) |
| *H10D 86/01* | (2025.01) |
| *H10D 86/40* | (2025.01) |
| *H10W 90/00* | (2026.01) |

(52) U.S. Cl.
CPC ........... *H10D 86/60* (2025.01); *H10D 86/021* (2025.01); *H10D 86/441* (2025.01); *H10W 90/00* (2026.01)

(58) Field of Classification Search
CPC .... H10D 86/021; H10D 86/441; H10D 86/60; H10H 20/01; H10H 20/8506; H10H 20/854; H10H 29/142; H10H 20/034; H10H 20/0362; H10H 20/852; H10H 20/857; H01L 25/0753; H01L 25/075; H01L 23/60; H01L 25/50; H01L 25/167
See application file for complete search history.

(56) References Cited

U.S. PATENT DOCUMENTS

| | | | |
|---|---|---|---|
| 9,447,308 B2 | 9/2016 | Albaugh et al. | |
| 12,278,226 B2 * | 4/2025 | Hong .................... | H10H 29/142 |
| 12,484,424 B2 * | 11/2025 | Huang ............... | H10K 59/8791 |
| 2021/0202650 A1 * | 7/2021 | Hong .................... | H10K 59/131 |
| 2022/0208945 A1 * | 6/2022 | Lee ..................... | H10K 59/1315 |
| 2022/0208951 A1 * | 6/2022 | Yoo ......................... | H10K 59/18 |
| 2022/0302362 A1 * | 9/2022 | Gong .................... | H10H 20/857 |
| 2022/0384492 A1 * | 12/2022 | Lu ......................... | H10D 86/451 |
| 2023/0005962 A1 * | 1/2023 | Lee ..................... | H01L 25/0753 |
| 2023/0025999 A1 * | 1/2023 | Huang .................... | H10H 29/24 |
| 2023/0126724 A1 * | 4/2023 | Hong .................... | H01L 25/075 |
| | | | 257/91 |

(Continued)

FOREIGN PATENT DOCUMENTS

| | | |
|---|---|---|
| KR | 20150127272 A | 11/2015 |
| KR | 20210063010 A | 6/2021 |
| KR | 20220091278 A | 6/2022 |

*Primary Examiner* — Victor A Mandala
(74) *Attorney, Agent, or Firm* — Seed Intellectual Property Law Group LLP

(57) ABSTRACT

Disclosed is a display device including: a first substrate on which a plurality of micro-LEDs are disposed; a second substrate bonded to one surface of the first substrate; a side wiring electrically connecting the first substrate and the second substrate to each other; a side surface sealing member covering the side wiring; and an antistatic film covering an outer surface of the side surface sealing member, wherein the side surface sealing member includes an organic filler and core-shell particles dispersed in the organic filler.

20 Claims, 8 Drawing Sheets

(56)             References Cited

U.S. PATENT DOCUMENTS

| | | | |
|---|---|---|---|
| 2023/0216003 A1* | 7/2023 | Lee | H10H 20/833 |
| | | | 257/79 |
| 2023/0246011 A1* | 8/2023 | Choi | H01L 24/08 |
| | | | 257/91 |
| 2023/0246148 A1* | 8/2023 | Lee | G09F 9/33 |
| | | | 257/79 |
| 2024/0178237 A1* | 5/2024 | Jeong | H01L 25/167 |
| 2024/0204149 A1* | 6/2024 | Lee | H10H 20/85 |
| 2024/0258325 A1* | 8/2024 | Liu | G09F 9/33 |

* cited by examiner

DISPLAY DEVICE AND METHOD FOR MANUFACTURING THE SAME

CROSS-REFERENCE TO RELATED APPLICATION

This application claims priority from Korean Patent Application No. 10-2022-0133480 filed on Oct. 17, 2022, in the Korean Intellectual Property Office, and all the benefits accruing therefrom under 35 U.S.C. 119, the contents of which in its entirety are herein incorporated by reference.

BACKGROUND

Technical Field

The present disclosure relates to a display device.

Description of the Related Art

A display device is applied to various electronic devices such as TVs, mobile phones, laptops and tablets. To this end, research to develop thinning, lightening, and low power consumption of the display device is continuing.

Among display devices, a light-emitting display device has a light-emitting element or a light source built therein and displays information using light generated from the built-in light-emitting element or light source. A display device including a self-light-emitting element may be implemented to be thinner than a display device with the built-in light source, and may be implemented as a flexible display device that may be folded, bent, or rolled.

The display device having the self-light-emitting element may include, for example, an organic light-emitting display device (OLED) including a light-emitting layer made of an organic material, or a micro-LED display device (micro light-emitting diode display device) including a light-emitting layer made of an inorganic material. In this regard, the organic light-emitting display device does not require a separate light source. However, due to material characteristics of the organic material that is vulnerable to moisture and oxygen, a defective pixel easily occurs in the organic light-emitting display device due to an external environment. On the contrary, the micro-LED display device includes the light-emitting layer made of the inorganic material that is resistant to moisture and oxygen and thus is not affected by the external environment and thus has high reliability and has a long lifespan compared to the organic light-emitting display device.

Further, the micro-LED display device is resistant to the external environment, and thus does not require a protective structure such as a sealing material, and various types of materials may be used as a material of a substrate of the device. Thus, the micro-LED display device may be thinner than the organic light-emitting display device and is more advantageous in being implemented as a flexible display device. Thus, the micro-LED display device is in the limelight as a next-generation display device.

When arranging a plurality of micro-LED display devices to implement a large area size display device, a structure, for example, a bezel for visually blocking a non-display area surrounding a display area from the user's field of view is disposed.

BRIEF SUMMARY

The disclosure is directed to a display device including an antistatic film and a manufacturing method thereof. A display device of the present disclosure includes a bezel area with reduced area. An embodiment of the present disclosure provides a display device including an antistatic film capable of protecting a side surface of the display device from external electric shock without performing a separate additional process.

Further, an embodiment of the present disclosure provides a display device capable of realizing a substantially zero bezel area in which a bezel area is disposed in a reduced space or is substantially absent even when an antistatic film is disposed.

Further, an embodiment of the present disclosure provides a method for manufacturing a display device that may prevent other circuit elements within the display device from being damaged by heat in a process of forming an antistatic film.

Technical features according to the present disclosure are not limited to those described herein. Other technical features and benefits according to the present disclosure that are not specifically mentioned may be understood based on following descriptions, and may be more clearly understood based on embodiments according to the present disclosure. Further, it will be easily understood that the technical features and benefits according to the present disclosure may be realized modifications and/or combinations of the embodiments described herein.

An aspect of the present disclosure provides a display device comprising: a first substrate on which a plurality of micro-LEDs are disposed; a second substrate bonded to one surface of the first substrate; a side wiring electrically connecting the first substrate and the second substrate to each other; a side surface sealing member covering the side wiring; and an antistatic film covering an outer surface of the side surface sealing member, wherein the side surface sealing member includes an organic filler and core-shell particles dispersed in the organic filler.

Another aspect of the present disclosure provides a method for manufacturing a display device, the method comprising: bonding a second substrate to one surface of a first substrate, wherein a plurality of micro-LEDs are disposed on an opposite surface to the one surface of the first substrate; forming a side wiring disposed on a side surface of each of the first substrate and the second substrate so as to electrically connect the first substrate and the second substrate to each other; forming a side surface sealing member covering the side wiring, wherein the side surface sealing member includes an organic filler and core-shell particles dispersed in the organic filler; cutting the side surface sealing member; and forming an antistatic film having a thickness inwardly from an outermost side surface of the cut side surface sealing member.

According to the aspects of the present disclosure, the antistatic film is disposed on the outer side surface of the side surface sealing member that protects the side surface of the display device, thereby preventing damage and defects of the display device due to external electric shock. Accordingly, the static electricity applied to the side surface of the display device may be discharged to the outside through the antistatic film, thereby preventing defects due to the static electricity.

Further, the distal side end of the antistatic film may be aligned with the distal side end of the cover member of the display device. Thus, the bezel area may be disposed in a reduced space or a zero bezel area in which the bezel area is substantially absent may be realized.

Further, according to the aspects of the present disclosure, the antistatic film may be formed via the sintering during the laser cutting process of cutting the side surface sealing member, thereby preventing the increase the number of process steps and improving process efficiency.

Further, according to the aspects of the present disclosure, the antistatic film may be formed by sintering the metal at a relatively low temperature, thereby preventing other circuit elements in the display device from being damaged by high temperatures.

Effects of the present disclosure are not limited to the effects mentioned above, and other effects not mentioned will be clearly understood by those skilled in the art from the descriptions below.

DETAILED DESCRIPTIONS

Figure 1:
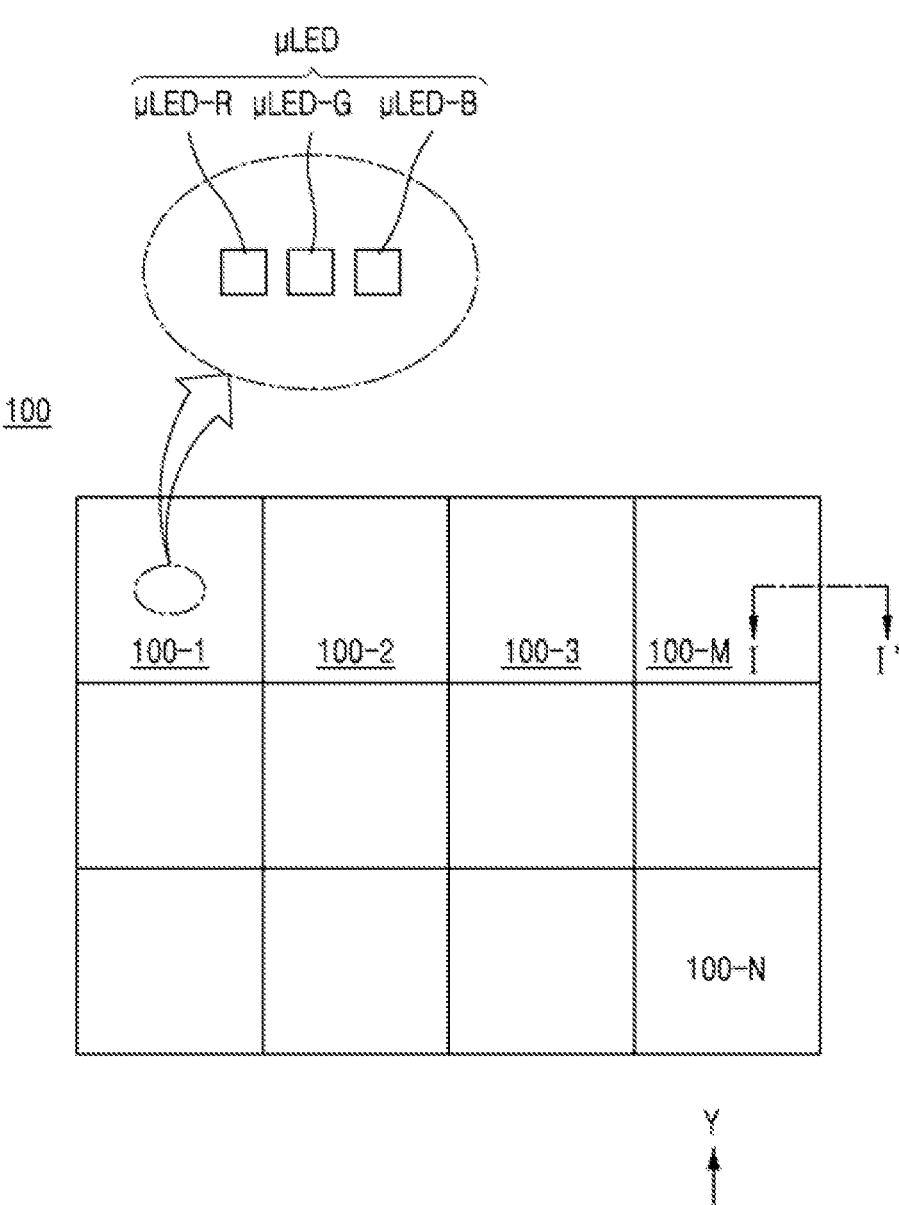
FIG. 1 is a schematic plan view of a display apparatus according to an embodiment of the present disclosure.

Technical benefits and features of the present disclosure, and a method of achieving the technical benefits and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure.

A shape, a size, a ratio, an angle, a number, etc., disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "including," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is not indicated.

When a certain embodiment can be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to," or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or.' That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display device according to each embodiment of the present disclosure will be described with reference to the accompanying drawings.

FIG. 1 is a schematic plan view of a display apparatus according to an embodiment of the present disclosure.

Referring to FIG. 1, a tiling display apparatus 100 according to the embodiment of the present disclosure may be configured to include a plurality of display devices 100-1, 100-2, 100-3 . . . 100-M and 100-N. In this regard, M and N may be natural numbers. The display device 100-1, 100-2, 100-3 . . . 100-M and 100-N may be arranged in a tiling manner such that adjacent display devices contact each other while the display devices are arranged along a first direction X and a second direction Y intersecting the first direction X. A pixel of each of the plurality of display devices 100-1, 100-2, 100-3 . . . 100-M and 100-N may include a plurality of micro-LEDs μLED. The micro-LEDs μLED may include a first micro-LED μLED-(R), a second micro-LED μLED-(G), and a third micro-LED μLED-B that emit red (R), green (G), and blue (B) light beams, respectively. However, the present disclosure is not limited thereto, and the micro-LEDs μLED may further include a white micro-LED emitting white (W) light.

In one example, when the tiling display apparatus 100 is implemented using the plurality of display devices 100-1, 100-2, 100-3 . . . 100-M and 100-N, a spacing between a micro-LED located at the outermost position of one display device and a micro-LED located at the outermost position of another display device adjacent thereto may be the same as a spacing between adjacent micro-LEDs located within each display device. Accordingly, the bezel area may be disposed in a reduced space or a zero bezel area in which the bezel area is substantially absent may be implemented. When a space occupied by the bezel area is reduced, a display area increases, such that the user recognizes that images appear continuously without discontinuity, and thus the user's screen immersion may increase.

Figure 2:
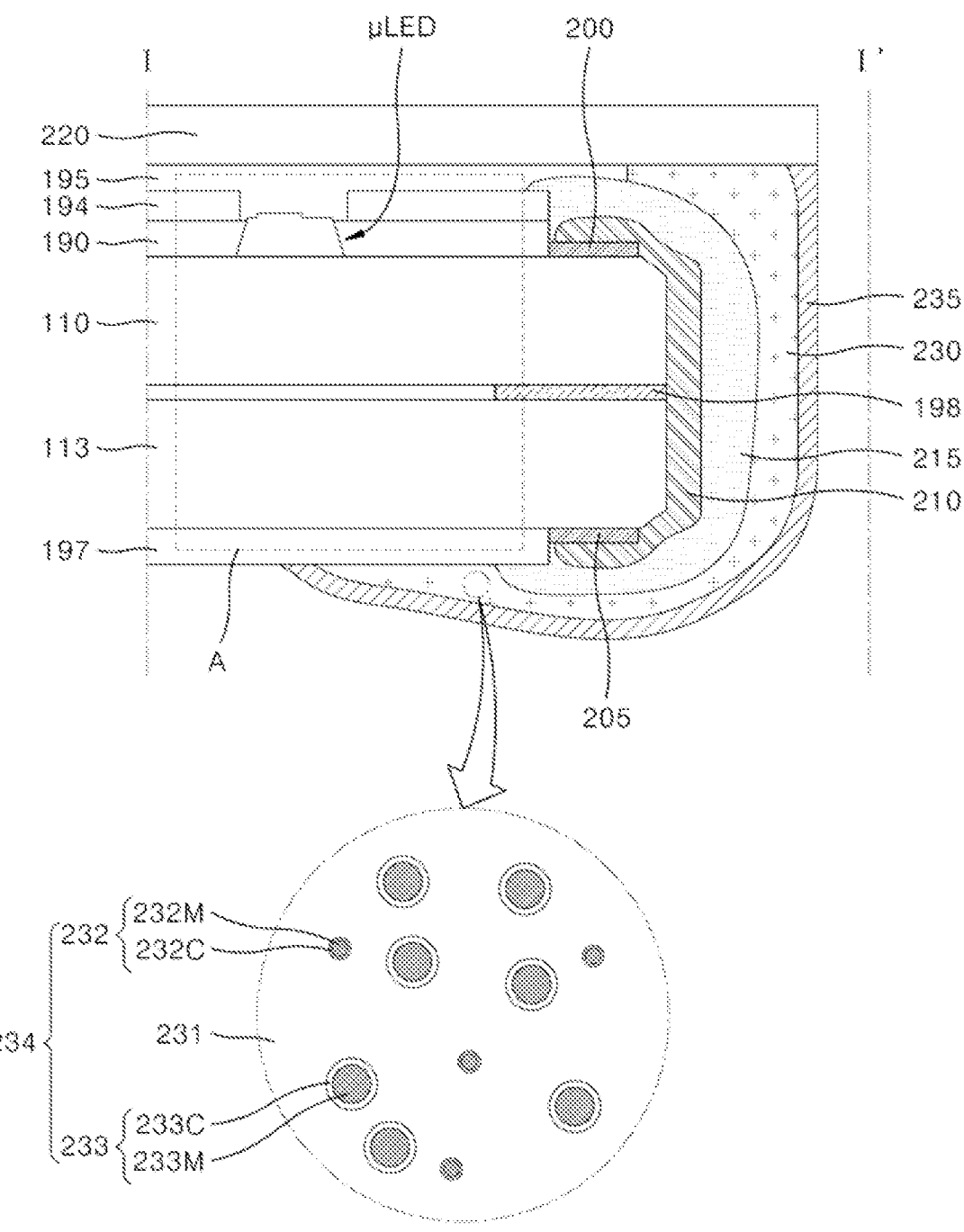
FIG. 2 is a cross-sectional view taken along a line II' of FIG. 1.
Figure 3:
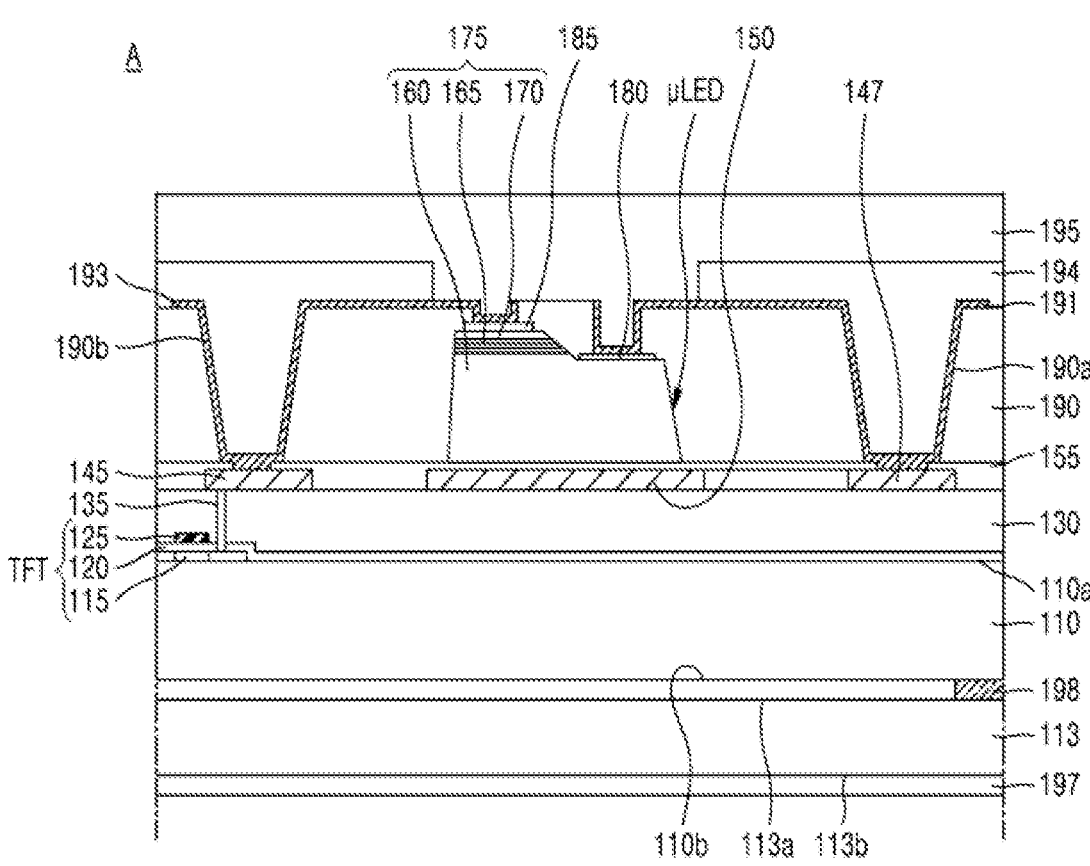
FIG. 3 is an enlarged cross-sectional view of some components as shown in an area A of FIG. 2.

FIG. 2 is a cross-sectional view taken along a line II' of FIG. 1. FIG. 3 is an enlarged cross-sectional view of some components as shown in an area A of FIG. 2. In this regard, in the drawing, only the micro-LED μLED located at the outermost position of the display device is shown for convenience of illustration.

Referring to FIG. 2 and FIG. 3, a substrate 110 and 113 includes a first substrate 110 and a second substrate 113. The first substrate 110 and the second substrate 113 are bonded to each other via an adhesive 198. The adhesive 198 is illustrated as being disposed only on the outermost position of each of the first substrate 110 and the second substrate 113. However, the present disclosure is not limited thereto. In one example, the adhesive 198 may be disposed over an entire area of a rear surface of the first substrate 110 and a front surface of the second substrate 113.

Each of the first substrate 110 and the second substrate 113 may include a transparent material including glass or plastic. However, the present disclosure is not limited thereto. For example, each of the first substrate 110 and the second substrate 113 may be made of a flexible transparent material. Further, the first substrate 110 and the second substrate 113 may be made of the same material as each other, or may be made of different materials.

On the first substrate 110, a micro-LED μLED, a thin-film transistor TFT for driving the micro-LED μLED and various wires are disposed. A first planarization layer 190 is disposed on the first substrate 110. The first planarization layer 190 may selectively cover the micro-LED μLED. A bank 194 having a bank hole formed therein may be disposed on the first planarization layer 190. A sealing layer 195 may be disposed on the bank 194.

A first pad 200 is disposed on the outermost position of the first substrate 110. A driver and the second pad 205 may be disposed on a rear surface of the second substrate 113 bonded to the first substrate 110. The driver may include a timing controller for driving the micro-LED μLED disposed on the first substrate 110, and a gate driver and a data driver for applying a gate signal and a data signal to a gate line and a data line, respectively.

A second pad 205 is disposed on the outermost position of the second substrate 113. Each of the first pad 200 and the second pad 205 may include a conductive material or metal. The rear surface of the second substrate 113 may be covered with a second planarization layer 197.

The first pad 200 disposed on the outermost position of the first substrate 110 and the second pad 205 disposed on the outermost position of the second substrate 113 may be electrically connected to each other via a side wiring 210. The side wiring 210 transmits a signal transmitted from the driver disposed on the rear surface of the second substrate 113 to the micro-LED μLED on the first substrate 110 such that the micro-LED μLED emits light. The side wiring 210 may include a conductive material or a metal material. In one example, the side wiring 210 may include silver (Ag).

A wiring protective film 215 may be disposed on the side wiring 210. The wiring protective film 215 serves to prevent abnormal phenomena such as migration of the conductive material or the metal material constituting the side wiring 210. The wiring protective film 215 may be disposed to surround an exposed outer surface of the side wiring 210. In addition, the wiring protective film 215 may cover a portion of the bank 194 located on the outermost position of the first substrate 110 and cover a portion of the second planarization layer 197 located on the outermost position of the second substrate 113.

The wiring protective film 215 may include an insulating material. In one example, the wiring protective film 215 may include a transparent material capable of blocking light, such as black ink.

A side surface sealing member 230 may be disposed on the wiring protective film 215. The side surface sealing member 230 may prevent damage to an entirety of the display device. The side surface sealing member 230 may be formed to cover the wiring protective film 215. The side surface sealing member 230 may extend so as to cover a portion of the wiring protective film 215 located on the second substrate 113 and cover a portion of the second planarization layer 197 located on the second substrate 113.

The side surface sealing member 230 may include an organic filler 231 and core-shell particles 234 dispersed in an organic filler 231. The core-shell particles 234 may include a plurality of first core-shell particles 232 and a plurality of second core-shell particles 233. The organic filler 231 may include acryl-based or urethane-based resin. The first core-shell particle 232 may be composed of a first core 232M made of a metal powder and a first shell 232C surrounding the first core 232M. In this regard, the metal powder constituting the first core 232M may include silver (Ag) or copper (Cu). The first shell 232C surrounding the first core 232M may be made of an organic material. In one example, the organic material may include silica. The first core-shell particle 232 may be formed to have a first size. In one example, the first core-shell particle 232 may have the first size smaller than 300 nanometers (nm).

The second core-shell particle 233 may have a second size larger than the first size of the first core-shell particle 232. In one example, the second core-shell particle 233 may have a size greater than 1 micrometer (μm).

The second core-shell particle 233 may be composed of a second core 233M made of a metal powder and a second shell 233C surrounding the second core 233M. The metal powder constituting the second core 233M may include silver (Ag) or copper (Cu). The metal powder constituting the second core 233M may be made of the same material as that of the metal powder constituting the first core 232M. However, the present disclosure is not limited thereto. Further, the second shell 233C surrounding the second core 233M may be made of an organic material. In one example, the organic material may include silica.

A content of the core-shell particles 234 dispersed in the organic filler 231 should not exceed 50% of a total content of the organic filler 231. For example, the core-shell particles 234 may be dispersed in a range of 30% to 50% in weight of the total content of the organic filler 231. Further, the first core-shell particles 232 and the second core-shell particles 233 may be dispersed in the organic filler 231 in a range of a content ratio of 2:6 to 4:8, preferably of 3:7, by weight.

An antistatic film 235 may be disposed on an outer surface of the side surface sealing member 230. The antistatic film 235 may be made of the same material as that of the metal powder constituting the core of each of the first core-shell particle 232 and the second core-shell particle 233. In one example, the antistatic film 235 may include silver (Ag) or copper (Cu). The antistatic film 235 has a surface resistance of $10^0$ to $10^3 \Omega/\square$ and may discharge the static electricity.

The antistatic film 235 may be formed along a shape of the outer surface of the side surface sealing member 230. For example, the antistatic film 235 may be formed on the outer surface of the side surface sealing member 230 which extends so as to cover a portion of the second planarization layer 197 located on the second substrate 113 while covering a portion of the wiring protective film 215 located on the second substrate 113.

A cover member 220 may be disposed on the side surface sealing member 230, the antistatic film 235, and the sealing layer 195. The cover member 220 may include glass or plastic. However, the present disclosure is not limited thereto. In one example, the cover member 220 may include a functional optical film such as an anti-scattering film.

The cover member 220 may be bonded to the side surface sealing member 230, the antistatic film 235, and the sealing layer 195 via an adhesive layer. However, the present disclosure is not limited thereto. The outermost side surface of the antistatic film 235 may be aligned with the outermost side surface of the cover member 220.

In one example, on the first substrate 110, the micro-LED μLED, the thin-film transistor TFT for driving the micro-LED μLED, and various wires may be disposed. Hereinafter, a portion of the A area where the micro-LED μLED is disposed in FIG. 2 will be described with reference to FIG. 3 as an enlarged view thereof.

Referring to FIG. 3, the thin-film transistor TFT driving the micro-LED μLED is disposed on a first surface 110a of the first substrate 110. A first surface 113*a* of the second substrate 113 may face a second surface 110*b* opposite to the first surface 110*a* of the first substrate 110. The driver and the second pad 205 are disposed on the second substrate 113. The second planarization layer 197 may be disposed on the second surface 113*b* of the second substrate 113. The first substrate 110 or the second substrate 113 may include a transparent material including glass or plastic.

The thin-film transistor TFT may include a semiconductor layer 115 formed on the first surface 110*a* of the first substrate 110, a gate electrode 125 positioned on the semiconductor layer 115, and a gate insulating layer 120 positioned between the semiconductor layer 115 and the gate electrode 125.

The semiconductor layer 115 may include an active area overlapping the gate electrode 125 to constitute a channel, and a source area and a drain area respectively located on both opposing sides of the active area interposed therebetween. An interlayer insulating film 130 is disposed on the gate electrode 125. The interlayer insulating film 130 may receive therein source/drain electrodes 135 extending through the gate insulating layer 120 so as to be respectively electrically connected to the source/drain areas of the semiconductor layer 115.

A connection electrode 145, a wiring line 147, and a reflective layer 150 may be disposed on the interlayer insulating film 130. The connection electrode 145, the wiring line 147, and the reflective layer 150 may be disposed in the same plane or coplanar with each other. In one example, the wiring line 147 may include a common voltage line. A protection layer 155 covering the connection electrode 145, the wiring line 147, and the reflective layer 150 is disposed on the interlayer insulating film 130. The protection layer 155 may not cover a portion of an upper surface of each of the connection electrode 145 and the wiring line 147 so as to be exposed.

The micro-LED μLED may be disposed on the protection layer 155 at a position corresponding to a position where the reflective layer 150 is disposed. The micro-LED μLED may include a nitride semiconductor structure 175, a first electrode 180 and a second electrode 185. The nitride semiconductor structure 175 may include a first semiconductor layer 160, an active layer 165 disposed on one side of a top surface of the first semiconductor layer 160, and a second semiconductor layer 170 disposed on the active layer 165. The first electrode 180 is disposed on the other side of the top surface of the first semiconductor layer 160 where the active layer 165 is not located. The second electrode 185 is disposed on the second semiconductor layer 170.

The first semiconductor layer 160 is a layer for supplying electrons to the active layer 165, and may include a nitride semiconductor containing the first conductivity type impurities. For example, the first conductivity-type impurity may include an N-type impurity. The active layer 165 disposed on one side of the top surface of the first semiconductor layer 160 may have a multi-quantum well (MQW) structure. The second semiconductor layer 170 is a layer for injecting holes into the active layer 165. The second semiconductor layer 170 may include a nitride semiconductor containing the second conductivity type impurity. For example, the second conductivity type impurity may include a P type impurity.

The reflective layer 150 serves to reflect light beams directed toward the second surface 110*b* of the first substrate 110 among light beams emitted from the micro-LED μLED toward the first surface 110*a*, that is, toward the first surface 110*a* of the first substrate 110.

The micro-LED μLED may be covered with the first planarization layer 190. The first planarization layer 190 may have a thickness sufficient to planarize an upper surface having a step caused by underlying circuit elements. A first contact-hole 190*a* and a second contact-hole 190*b* may be formed in the first planarization layer 190 to expose portions of surfaces of the wiring line 147 and the connection electrode 145, respectively. Further, the first planarization layer 190 may not cover a portion of an upper surface of each of the first electrode 180 and the second electrode 185 of the micro-LED μLED so as to be exposed.

A first line electrode 191 and a second line electrode 193 may be disposed on exposed surfaces of the first contact-hole 190*a* and the second contact-hole 190*b*, respectively, so as to be electrically connected to the wiring line 147 and the drain electrode of the semiconductor layer 115 of the thin-film transistor TFT, respectively. Further, the first line electrode 191 may be electrically connected to the first electrode 180. The second line electrode 193 may be electrically connected to the second electrode 185. The first line electrode 191 and the second line electrode 193 may be made of the same material. In one example, the first line electrode 191 or the second line electrode 193 may include a transparent metal oxide such as indium-tin-oxide (ITO) or indium-zinc-oxide (IZO).

The bank 194 having a bank hole formed therein is disposed on the first planarization layer 190. The bank 194 is a boundary area defining the light-emitting area and plays a role in defining each sub-pixel. In one example, the first contact-hole 190*a* and the second contact-hole 190*b* on which the first line electrode 191 and the second line electrode 193 have been respectively formed may be filled with a material constituting the bank 194. Although not shown in the drawing, a black matrix may be disposed on the bank 194. A sealing layer 195 may be disposed on the first substrate 110 including the bank 194.

In the display device according to an embodiment of the present disclosure, the side surface sealing member 230 protecting the side wiring 210 and the wiring protective film 215 may include the organic filler 231 and the core-shell particles 234 dispersed in the organic filler 231. In addition, the antistatic film 235 may be made of the same material as the metal material constituting the core of each of the first core-shell particle 232 and the second core-shell particle 233.

This antistatic film 235 may prevent damage and defects of the display device due to external electric shock. In particular, the antistatic film 235 may discharge the static electricity applied to the side surface of the display device to the outside, such that defects due to the static electricity may be prevented. In addition, the distal side end of the antistatic film 235 may be aligned with the distal side end of the cover member 220, such that the bezel area may be disposed in a reduced space or a zero bezel area where the bezel area is substantially absent may be implemented.

FIG. 4 to FIG. 8 are diagrams for illustrating a method for manufacturing a display device according to an embodiment of the present disclosure.

Figure 4:
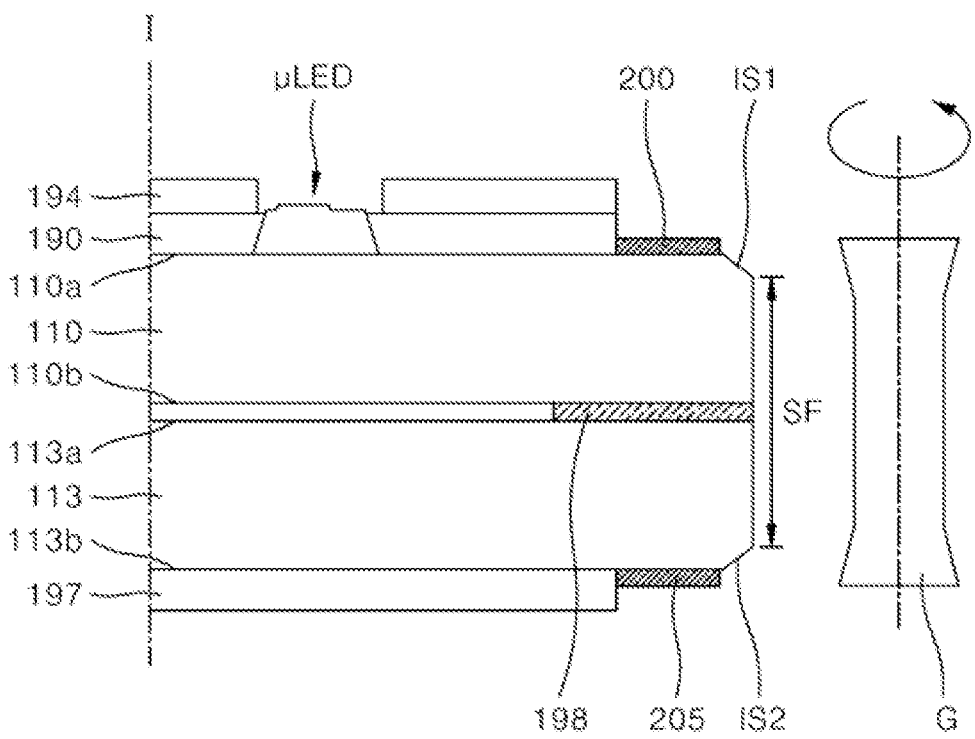
FIG. 4 to FIG. 8 are diagrams for illustrating a method for manufacturing a display device according to an embodiment of the present disclosure.

Referring to FIG. 4, the method prepares the substrates 110 and 113, wherein the micro-LED μLED is disposed on the substrate 110. In addition, inclined surfaces IS1 and IS2 are formed at the outermost portions of the substrates 110 and 113, respectively. The inclined surfaces IS1 and IS2 respectively disposed at the outermost portions of the substrates 110 and 113 may be formed using a grind wheel device G.

The substrates 110 and 113 include the first substrate 110 and the second substrate 113. The first substrate 110 and the second substrate 113 are bonded to each other via the adhesive 198. The first substrate 110 may include the first surface 110a on which the micro-LED μLED is disposed, the second surface 110b opposite the first surface 110a, and a first side surface disposed between the first surface 110a and the second surface 110b. The first surface 113a of the second substrate 113 may be bonded to the second surface 110b opposite to the first surface 110a of the first substrate 110. The second substrate 113 may include the first surface 113a bonded to the first substrate 110, the second surface 113b opposite to the first surface 113a, and a second side surface disposed between the first surface 113a and the second surface 113b.

As a configuration of the micro-LED μLED in FIG. 4 is the same as that of the micro-LED μLED as described in FIG. 3, a detailed description thereof will be omitted.

The inclined surfaces IS1 and IS2 respectively disposed at the outermost portions of the substrates 110 and 113 may include the first inclined surface IS1 disposed above the first side surface of the first substrate 110 and the second inclined surface IS2 disposed under the second side surface of the second substrate 110. The inclined surfaces IS1 and IS2 may prevent edges of the substrates from colliding with each other and being damaged when the plurality of display devices 100-1, 100-2, 100-3 . . . 100-M, 100-N (see FIG. 1) are arranged and assembled with each other. The grind wheel device G may cut corners from the surfaces of the outermost portions of the substrates 110 and 113 to form the inclined surfaces IS1 and IS2.

Figure 5:
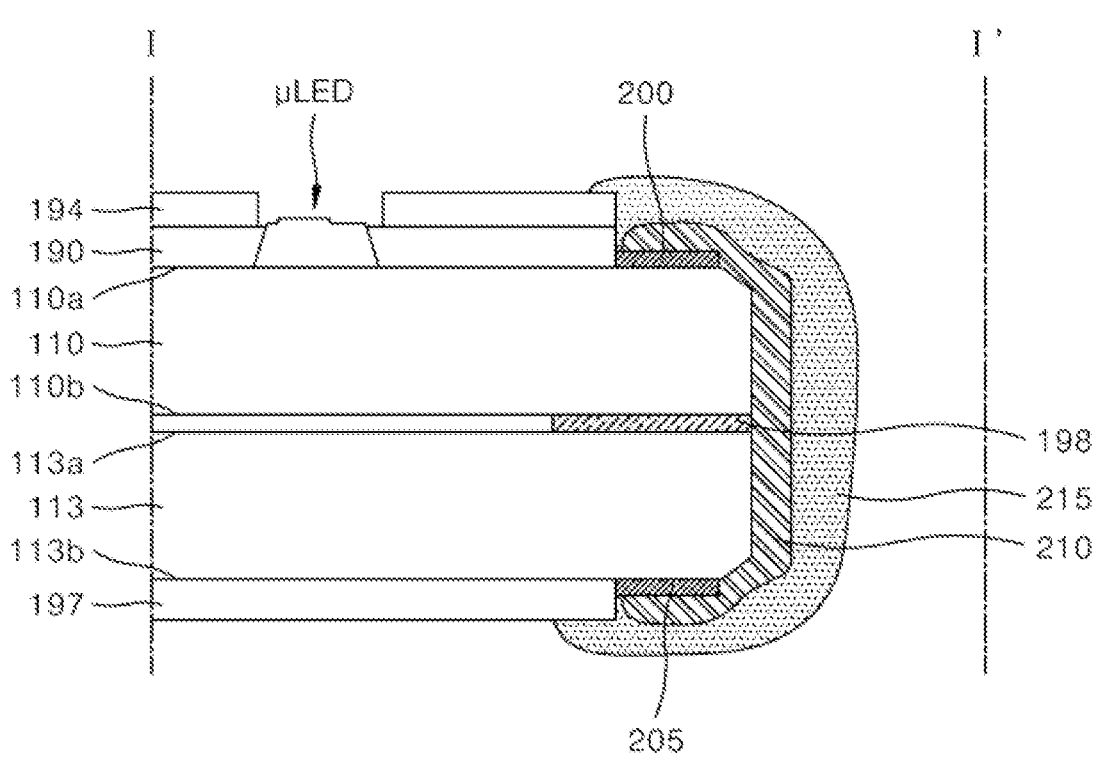

Referring to FIG. 5, the side wiring 210 is formed on the side surfaces of the first substrate 110 and the second substrate 113. The side wiring 210 may electrically connect the first pad 200 disposed on the outermost position of the first substrate 110 and the second pad 205 disposed on the outermost position of the second substrate 113 to each other. The side wiring 210 may include a conductive material or a metal material. In one example, the side wiring 210 may include silver (Ag). The side wiring 210 may be formed by applying a conductive material or a metal material in a form of a paste to the side surfaces of the first substrate 110 and the second substrate 113 and performing a drying and curing process thereon. The side wiring 210 transmits a signal transmitted from the driver disposed on the rear surface of the second substrate 113 to the micro-LED μLED disposed on the first substrate 110 so as to emit light.

The side wiring 210 covers the first pad 200 disposed on the first surface 110a of the first substrate 110 and extends along and on the side surface of the first substrate 110 and the side surface of the second substrate 113 and covers the second pad 205 disposed on the second surface 113b of the second substrate 113.

Subsequently, the wiring protective film 215 is formed on the side wiring 210. The wiring protective film 215 serves to prevent abnormal phenomena such as migration of the conductive material or metal material constituting the side wiring 210. Further, the wiring protective film 215 serves to prevent the side wiring 210 from being damaged by the external environment. The wiring protective film 215 may include an insulating material. For example, the wiring protective film 215 may be formed by pad-printing a black ink material. The pad-printing scheme may be understood as a scheme in which the black ink is applied to a printing pad made of silicon and then the printing pad is brought into contact with each of the side surfaces of the first substrate 110 and the second substrate 113 such that the black ink is formed thereon.

Figure 6:
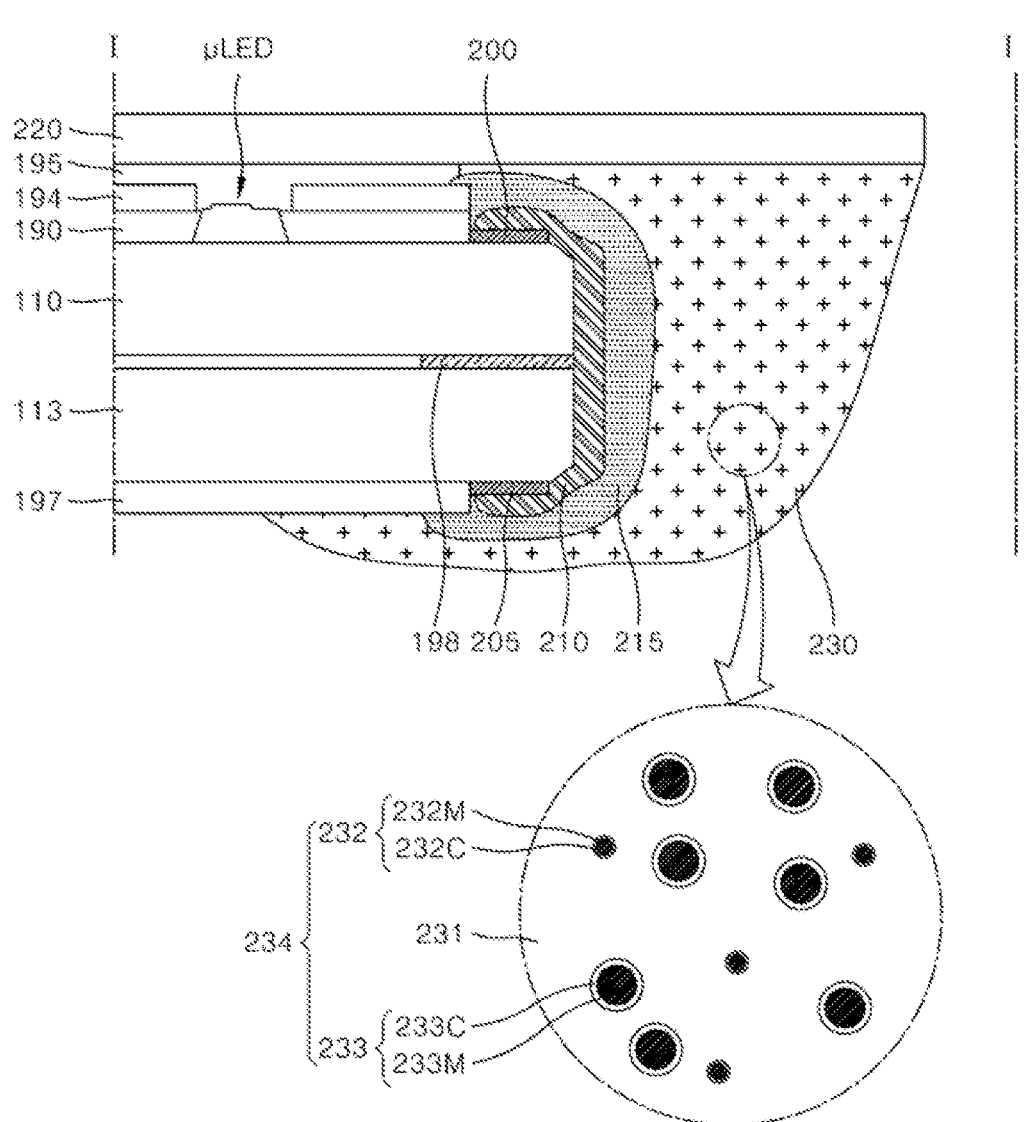

Referring to FIG. 6, the sealing layer 195 and the cover member 220 may be disposed on the first substrate 110. The sealing layer 195 may prevent the micro-LED μLED from being damaged by foreign substances. The cover member 220 may protect the micro-LED μLED from external impact. The cover member 220 may include glass or plastic. However, the present disclosure is not limited thereto. For example, the cover member 220 may include a functional optical film such as an anti-scattering film.

Subsequently, the side surface sealing member 230 is formed on the side surfaces of the first substrate 110 and the second substrate 113. The side surface sealing member 230 serves to protect the side wiring 210 and the driver disposed on the second substrate 113. The side surface sealing member 230 may be formed to have a thickness sufficient to cover both the side surfaces of the first substrate 110 and the second substrate 113. The side surface sealing member 230 may be formed by extend so as to cover a portion of the surface of the second planarization layer 197 disposed on the second substrate 113 in order to protect the driver disposed on the second substrate 113.

The side surface sealing member 230 may be formed by applying the organic filler 231 in which the core-shell particles 234 are dispersed, and UV-curing the applied organic filler 231. The organic filler 231 may include acryl or urethane-based resin. The core-shell particles 234 may include the plurality of first core-shell particles 232 and the plurality of second core-shell particles 233. The first core-shell particle 232 may include the first core 232M made of the metal powder and the first shell 232C surrounding the first core 232M. In this regard, the metal powder constituting the first core 232M may include silver (Ag) or copper (Cu). The first shell 232C surrounding the first core 232M may be made of an organic material. In one example, the organic material may include silica. The silica may include hollow silica or mesoporous silica containing therein pores. The mesoporous silica may refer to a porous material having large pores of a mesoporous range of 2 nm to 50 nm. When the first shell 232C include the organic material, the first core-shell particles 232 may be easily dispersed in the organic filler 231.

The first core-shell particle 232 may be formed to have the first size. In one example, the first core-shell particle 232 may have a size smaller than 300 nanometers (nm).

The second core-shell particle 233 may be composed of the second core 233M made of the metal powder and the second shell 233C surrounding the second core 233M. The metal material constituting the second core 233M may include silver (Ag) or copper (Cu). The metal powder constituting the second core 233M may be made of the same material as that of the metal powder constituting the first core 232M of the first core-shell particle 232. However, the present disclosure is not limited thereto. Further, the second shell 233C surrounding the second core 233M may be made of an organic material. In one example, the organic material may include silica. The silica may include hollow silica or mesoporous silica containing pores of the first size therein. When the second shell 233C includes the organic material, the second core-shell particles 233 may be effectively dispersed in the organic filler 231.

Further, the second core-shell particle 233 may have the second size larger than the first size. In one example, the second core-shell particle 233 may have a size greater than 1 micrometer (μm). The first core-shell particles 232 and the second core-shell particles 233 are dispersed together in the organic filler 231. The sintering may not be proceed well when the first core-shell particles 232 dispersed together in the organic filler 232 have a size exceeding 300 nm, or the second core-shell particles 233 have a small size of less than 1 micrometer (μm). The sintering may refer to a process in which the metal powder constituting the first core 232M and the second core 233M melts such that the first core-shell particle 232 and the second core-shell particle 233 adhere to and agglomerate each other and become hardened. There-fore, the first core-shell particle 232 preferably has a size smaller than 300 nanometers (nm), and the second core-shell particle 233 may has a size larger than 1 micrometer (μm). The differences in the sizes of the core-shell particles are critical in the formation of an antistatic film from a portion of the side surface sealing member 230, as will be further described herein.

A content in weight of the core-shell particles 234 dis-persed in the organic filler 231 should not exceed 50% of the total content of the organic filler 231. For example, the content of the core-shell particles 234 is in a range of 30% to 50% of the total content in weight of the organic filler 231.

Further, it is desirable that the content in weight of the second core-shell particles 233 with the second size rela-tively larger than the first size of the first core-shell particle 232 is greater than the content in weight of the first core-shell particles 232 having the first size. In one example, a ratio of the content of the first core-shell particles 232 and the content of the second core-shell particles 233 dispersed in the organic filler 231 may be in a range of 2:6 to 4:8, inclusive. In some implementations, a ratio of the content of the first core-shell particles 232 and the content of the second core-shell particles 233 dispersed in the organic filler 231 is 3:7.

Figure 7:
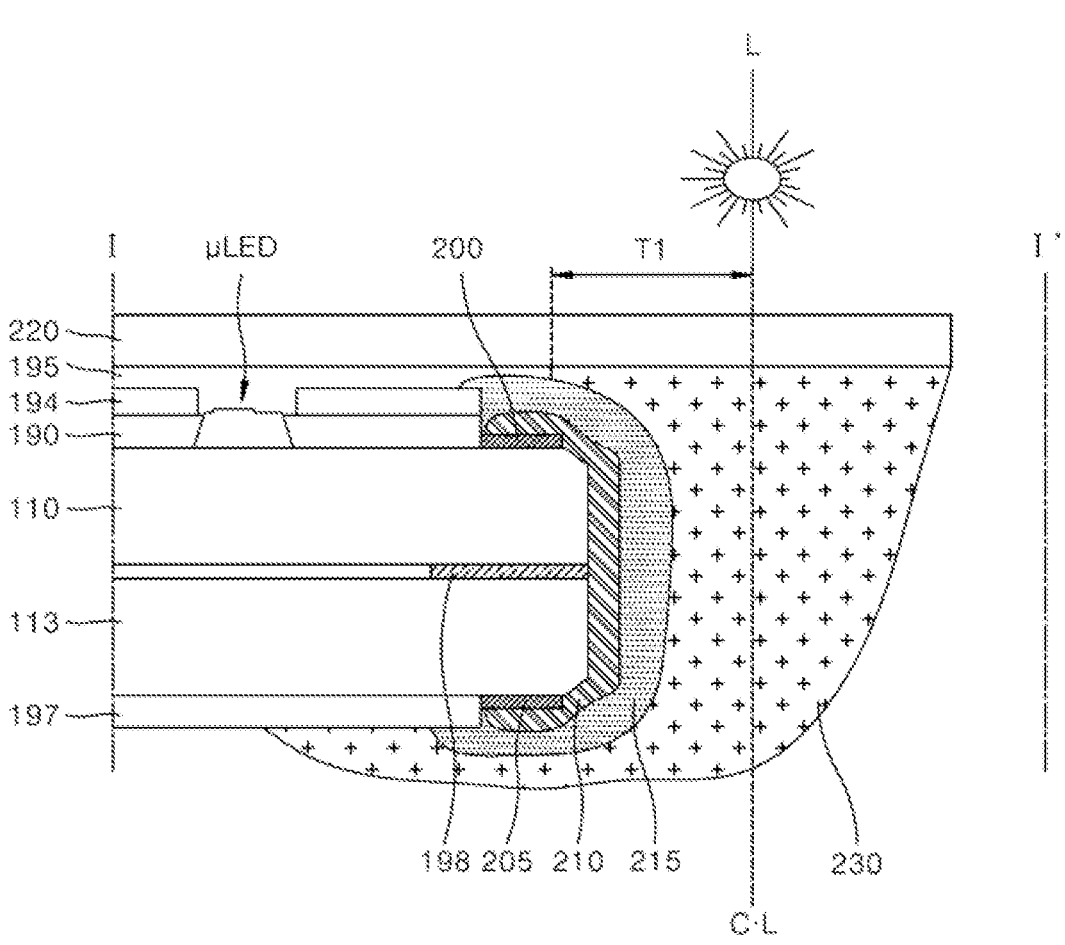
Figure 8:
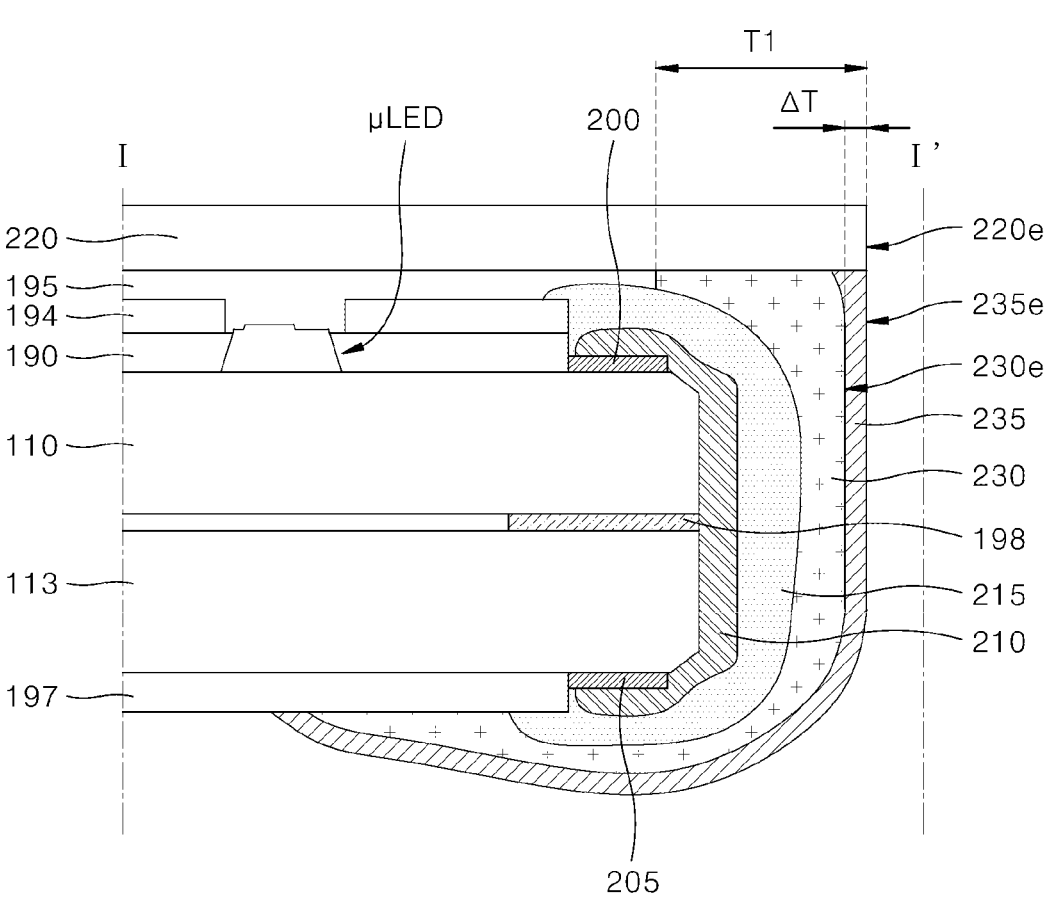

Referring to FIG. 7, a laser cutting process of cutting the side surface sealing member 230 along a cutting line C.L using a laser device L is performed. Then, as shown in FIG. 8, the antistatic film 235 having a predetermined thickness ΔT from the outermost surface 230e of the cut side surface sealing member 230 may be formed. The outer side surface 235e of the antistatic film 235 may be aligned with the outermost side surface 220e of the cover member 220 in a line.

Referring back to FIG. 7, the laser cutting process cuts a portion of a width of each of the cover member 220 and the side surface sealing member 230 to implement a zero bezel area where the bezel area Ti is disposed in a reduced space or the bezel area Ti is absent. The cutting process using the laser device L may be performed by repeatedly irradiating a laser beam onto the side surface sealing member 230. According to one embodiment, during the laser cutting process, the laser beam may be irradiated to the cutting line C.L as a target point in a repeated manner.

When the laser beam is repeatedly irradiated onto the side surface sealing member 230, the temperature of the irradi-ated area increases. When the temperature of the irradiated area increases, the metal powder constituting each of the first core 232M and the second core 233M contained in the side surface sealing member 230 in a position overlapping the cutting line C.L may be sintered to form the antistatic film 235. The sintering may refer to a process in which the metal powder constituting the first core 232M and the second core 233M melts such that the first core-shell particle 232 adhere to and agglomerate each other and become hardened. As the antistatic film 235 is formed by sintering the metal powder constituting the first core 232M and the second core 233M contained in the side surface sealing member 230, the antistatic film 235 may have the thickness from the side outer surface of the cut side surface sealing member 230 to an inner side surface of the antistatic film 235. That is, the side outer surface of the cut side surface sealing member 230 may be the outer side surface of the antistatic film 235. The antistatic film 235 may be made of the same material as that of the metal powder constituting the first core-shell particle 232 and the second core-shell particle 233, while in the sintered state. In one example, the antistatic film 235 may include silver (Ag) or copper (Cu).

The surface resistance of the antistatic film 235 formed according to the embodiment of the present disclosure may have $10^0$ to $10^3\Omega/\square$. The surface resistance for effectively performing static electricity discharge (ESD) may be in a range of $10^0$ to $10^3\Omega/\square$. When the surface resistance is greater than $10^3\Omega/\square$, the antistatic film 235 is ineffective in discharging static electricity. In some implementations, the surface resistance of the antistatic film 235 should be in the range of $10^0$ to $10^3\Omega/\square$.

The antistatic film 235 serves to prevent damage to the display device or occurrence of defects due to unnecessary voltage or static electricity applied from the outside. In particular, in the display device having the cover member 220, an antistatic function is imparted to the cover member 220 or the adhesive layer for attaching the cover member 220 to an underlying layer to cope with external voltage or static electricity applied to the front surface of the device. However, when there is no antistatic film on the side surface of the display device at which the side surface sealing member made of the organic material is located, there is no path to discharge the static electricity applied to the side surface to the outside, and a thickness of the side surface sealing member is small for the realization of the zero bezel, such that a short circuit or pad corrosion may occur by an external electric shock toward the side surface of the device, thereby causing an operation failure of the device. In one example, when the cover member is disposed on a front surface from which an image is displayed, and only the side surface sealing member made of the organic material is disposed on the side surface of the display device, and the antistatic film is absent on the side surface, the front surface of the display device is not damaged even when an electric shock of 15 kV is applied thereto, whereas the side surface thereof is damaged when an electric shock of 7 kV or lower is applied thereto.

In order to prevent the display device from the failure due to the static electricity applied to the side surface thereof, a conductive material layer may be formed on the side surface of the side surface sealing member 230 in an additional process using a deposition scheme, a pad-printing scheme, or a dotting scheme. However, this scheme uses high-temperature heat of 200 degrees C. and is affected by the heat resistance of the material constituting the cover member or the side surface sealing member, and thus has a limitation in that the scheme is used only in a limited manner.

Further, when the conductive material layer is formed using the above-mentioned additional process, a process time increases due to the increase in the number of process steps, and it is difficult to implement a zero bezel due to the thickness or the width of the material constituting the conductive material layer.

Accordingly, in an embodiment of the present disclosure, a method of forming the antistatic film 230 which is capable of realizing the zero bezel without introducing the separate additional process is introduced. This will be described with reference to a table below.

[Table 1] below shows change in the surface resistance of the antistatic film based on the content (%) of the metal powders dispersed in the organic filler when the antistatic film is formed using the organic filler in which the metal powders are dispersed. In this regard, the metal powder dispersed in the organic filler is not in the form of the core-shell particle, but is made of a single material. The antistatic film according to [Table 1] may be formed in a scheme in which the metal powder is sintered by irradiating a laser beam thereto.

TABLE 1

| | Examples | | | | | | |
|---|---|---|---|---|---|---|---|
| | Comparative Example | Present Example 1 | Present Example 2 | Present Example 3 | Present Example 4 | Present Example 5 | Present Example 6 |
| Content[%] of metal powders | X | 5 | 10 | 20 | 30 | 40 | 50 |
| Surface resistance [$\Omega/\square$] | $10^{13}$ | $10^{10}$ | $10^{10}$ | $10^{10}$ | $10^{9}$ | $10^{10}$ | $10^{11}$ |

Comparative Example shows the surface resistance of the side surface sealing member formed using a single material of the organic filler without the metal powder. Further, Present Example 1 to Present Example 6 show the surface resistance of the film obtained via sintering of the metal particles of the side surface sealing member when the metal particles are dispersed in the organic filler at a content of 5% to 50%. Referring to [Table 1], Comparative Example shows that the surface resistance has $10^{13}\Omega/\square$ which is larger than the surface resistance of $10^{0}$ to $10^{3}\Omega/\square$ which can realize an antistatic function. Thus, it may be identified that the single material of the organic filler cannot perform the antistatic function. To the contrary, it may be identified that as in Present Example 1 to Example 6, when the metal powders are dispersed in the organic filler, the surface resistance decreases as the content thereof increases. However, it may be identified that when the content of the metal powder in the organic filler is higher than 50%, the surface resistance does not decrease any more from $10^{11}\Omega/\square$ and has the same surface resistance.

Further, when the metal powders in the form of core-shell particles are not dispersed in the organic filler, but the side surface sealing member is formed using a single material of the organic filler without the metal powder, the surface resistance of $10^{0}$ to $10^{3}\Omega/\square$ which can realize an antistatic function could not be implemented even when the content of the metal powder in the organic filler has been increased.

In other words, when the core-shell particle is not dispersed in the organic filler, but the metal powder made of the single material is dispersed therein, the film obtained via the sintering of the metal power cannot function as an antistatic film. Thus, defects may be caused by the static electricity.

[Table 2] below shows change in the surface resistance of the antistatic film based on the content (%) of the core-shell particles in the organic filler when the antistatic film is formed using the organic filler in which the core-shell particles are dispersed. In this regard, all of the core-shell particles dispersed in the organic filler have the same size. The antistatic film according to [Table 2] may be formed in a scheme in which the metal powder constituting the core of the core-shell particle is sintered by irradiating a laser beam thereto.

TABLE 2

| | Examples | | | | | | | |
|---|---|---|---|---|---|---|---|---|
| | Comparative Example | Present Example 1 | Present Example 2 | Present Example 3 | Present Example 4 | Present Example 5 | Present Example 6 | Present Example 7 |
| Content of core-shell particles [%] | X | 5 | 10 | 20 | 30 | 40 | 50 | 60 |
| Surface resistance [$\Omega/\square$] | $10^{13}$ | $10^{10}$ | $10^{10}$ | $10^{10}$ | $10^{9}$ | $10^{8}$ | $10^{6}$ | $10^{6}$ |

Comparative Example shows the surface resistance of the side surface sealing member made of a single organic filler material. Further, Present Example 1 to Present Example 7 show the surface resistance of the film obtained via sintering of the core-shell particles of the side surface sealing member when the core-shell particles having the same size are dispersed in the organic filler at a content of 5% to 60%. Referring to [Table 2], it may be identified that the comparative example shows that the surface resistance has a magnitude of $10^{13}\Omega/\square$, and thus cannot play a role as an antistatic film. It may be identified that in Present Example 1 to Present Example 7, as the content of the core-shell particles in the organic filler increases, the surface resistance decreases, and the surface resistance has a lower value than that in the [Table 1] using the single material of the metal powder. However, it may be identified that when the content of the core-shell particles in the organic filler is higher than 50%, the surface resistance does not decrease any more and has the same surface resistance. Further, when only the core-shell particles having the same size are used, the resistance value smaller than $10^{3}\Omega/\square$ which can achieve an antistatic function cannot be implemented.

In other words, the film as obtained by sintering the metal powers constituting the cores of the core-shell particles having the same size cannot act as the antistatic film. Thus, defects due to the static electricity cannot be effectively prevented.

On the contrary, in an embodiment of the present disclosure, the core-shell particles having different sizes are dispersed in the organic filler at different content ratios, and then the side surface sealing member is made of the dispersion. A laser beam is irradiated onto this side surface sealing member to sinter the metal powder to form an antistatic film. Hereinafter, a description thereof will be made with reference to [Table 3].

conducted at a sintering temperature of 140° C. In this case, the surface resistance in Present Example 3 in which a ratio of the content (a) of the first core-shell particles of the relatively small size of the first size and the content (b) of the second core-shell particles of the relatively large size of the second size as dispersed in the organic filler is 3:7 has $10^2\Omega/\square$ and $10^3\Omega/\square$, which is the lowest surface resistance.

Accordingly, it may be identified that the antistatic film formed by sintering the mixture of the first core-shell particles and the second core-shell particles at the mixing ratio of 3:7 as in Present Example 3 may be most effective in the electrostatic discharge (ESD).

TABLE 3

| | | Examples | | | | | | | | | |
|---|---|---|---|---|---|---|---|---|---|---|---|
| | | Comparative Example | Present Example 1 | | Present Example 2 | | Present Example 3 a:b | | Present Example 4 | | Present Example 5 | |
| | | | 5:5 | | 7:3 | | 3:7 | | 0:10 | | 10:0 | |
| | | X X | Present Example 1-1 | Present Example 1-2 | Present Example 2-1 | Present Example 2-2 | Present Example 3-1 | Present Example 3-2 | Present Example 4-1 | Present Example 4-2 | Present Example 5-1 | Present Example 5-2 |
| Sintering temperature | | X | ~200 | 140 | ~200 | 140 | ~200 | 140 | ~200 | 140 | ~200 | 140 |
| Surface resistance | | $10^{13}$ | $10^4$ | $10^5$ | $10^5$ | $10^6$ | $10^2$ | $10^3$ | $10^4$ | $10^7$ | $10^6$ | $10^6$ |

In [Table 3], a:b represents a mixing ratio of the first core-shell particle of the first size and the second core-shell particle of the second size. a indicates a content of the first core-shell particles of the first size smaller than 300 nm, and b indicates a content of the second core-shell particles of the second size larger than 1 micrometer. The sintering temperature is expressed in ° C. unit, and the surface resistivity is expressed in [$\Omega/\square$] unit. In this regard, the core-shell particles including the first core-shell particles and the second core-shell particles are dispersed in the organic filler in the range of 30% to 50% of the total content of the organic filler. Referring to [Table 3], in each of Present Example 1 to Present Example 5, the first core-shell particles (a) of the first size and the second core-shell particles (b) of the second size are dispersed in the organic filler, and the sintering is performed thereon at the sintering temperature. Then, the surface resistance is measured.

In each of Present Example 1-1, Present Example 2-1, Present Example 3-1, Present Example 4-1, and Present Example 5-1, the sintering is conducted at a sintering Further, the antistatic film formed by sintering the mixture of the first core-shell particles and the second core-shell particles under a condition (e.g., a:b being 4:6 or 2:8) that the content (b) of the second core-shell particles of the relatively large second size is higher than the content (a) of the first core-shell particles of the relatively small first size has the surface resistance in a range of $10^2$ to $10^3\Omega/\square$ even and thus performs the antistatic function. In some implementations, the ratio of the content (b) of the second core-shell particles of the second size and the content (a) of the first core-shell particles of the first size smaller than the second size is in a range of 6:4 to 8:2.

As the laser cutting is repeated, the temperature applied to the side surface sealing member by the laser increases. As the temperature applied to the sealing member increases, this may affect the sintering amount of metal particles. The sintering amount of the metal particles may affect the surface resistance.

TABLE 4

| | Examples | | | | | |
|---|---|---|---|---|---|---|
| | Comparative Example | Present Example 1 | Present Example 2 | Present Example 3 | Present Example 4 | Present Example 5 |
| Number of times of laser irradiations | 12 times | 12 times | 12 times | 12 times | 12 times | 12 times |
| Surface resistance [$\Omega/\square$] | $10^{13}$ | $10^6$ | $10^6$ | $10^3$ | $10^8$ | $10^7$ | temperature lower than 200° C. In each of Present Example 1-2, Present Example 2-2, Present Example 3-2, Present Example 4-2 and Present Example 5-2, the sintering is Other conditions in Comparative Example and in Present Example 1 to Present Example 5 in [Table 4] are the same as those in [Table 3]. In this case, in Present Example 3 where the ratio of the content (a) of the first core-shell particles of the relatively small size of the first size and the content (b) of the second core-shell particles of the relatively large size of the second size as dispersed in the organic filler is 3:7, even when the number of times of laser irradiations increases, the surface resistance is maintained at $10^3\Omega/\square$, and has the lowest surface resistance. Accordingly, the antistatic film can effectively discharge the static electricity. In an conventional case, when the cover member is disposed on a front surface of the display device from which an image is displayed, and only the side surface sealing member made of the organic material is disposed on the side surface of the display device, and the antistatic film is absent on the side surface, the front surface of the display device is not damaged even when an electric shock of 15 kV is applied thereto, whereas the side surface thereof is damaged when an electric shock of 7 kV or lower is applied thereto. However, in accordance with the present disclosure, when the antistatic film 235 according to an embodiment of the present disclosure is disposed on the outer side surface of the side surface sealing member 230, defect may not occur even when the electric shock of 15 kV is applied to the side surface thereof.

According to the embodiments of the present disclosure, the antistatic film is disposed on the outer side surface of the side surface sealing member that protects the side surface of the display device, thereby preventing damage and defects of the display device due to external electric shock. Accordingly, the static electricity applied to the side surface of the display device may be discharged to the outside through the antistatic film, thereby preventing defects due to the static electricity.

Further, the distal side end of the antistatic film may be aligned with the distal side end of the cover member of the display device. Thus, the bezel area may be disposed in a reduced space or a zero bezel area in which the bezel area is substantially absent may be realized.

Further, according to the embodiments of the present disclosure, the antistatic film may be formed via the sintering during the laser cutting process of cutting the side surface sealing member, thereby preventing the increase the number of process steps and improving process efficiency.

Further, according to the embodiments of the present disclosure, the antistatic film may be formed by sintering the metal at a relatively low temperature, thereby preventing other circuit elements in the display device from being damaged by high temperatures.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects. All technical ideas within an equivalent scope thereto should be interpreted as being included in the scope of rights of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
   a first substrate on which a plurality of micro-LEDs are disposed;
   a second substrate bonded to a first surface of the first substrate;
   a side wiring electrically connecting the first substrate and the second substrate to each other;
   a side surface sealing member on the side wiring; and
   an antistatic film on an outer surface of the side surface sealing member,
   wherein the side surface sealing member includes an organic filler and core-shell particles dispersed in the organic filler.

2. The display device of claim 1, wherein the first substrate includes a first pad disposed on an outermost position of the first substrate,
   wherein the second substrate includes a second pad disposed on an outermost position of the second substrate, and
   wherein the side wiring overlaps each of the first pad and the second pad.

3. The display device of claim 1, further comprising a wiring protective film disposed between the side wiring and the side surface sealing member, the wiring protective film covering the side wiring.

4. The display device of claim 1, further comprising a cover member disposed on the side surface sealing member and a portion of the first substrate,
   wherein an outermost side surface of the antistatic film is substantially aligned with an outermost side surface of the cover member.

5. The display device of claim 1, wherein the side surface sealing member overlaps a portion of a surface of the second substrate, and
   wherein the antistatic film extends along a profile of the side surface sealing member.

6. The display device of claim 1, wherein the core-shell particles include a plurality of first core-shell particles and a plurality of second core-shell particles dispersed in the organic filler,
   wherein each of the plurality of first core-shell particles has a first size and each of the plurality of second core-shell particles has a second size larger than the first size.

7. The display device of claim 6, wherein each of the plurality of first core-shell particles includes a first core including a first metal powder and a first shell surrounding the first core,
   wherein each of the plurality of second core-shell particles includes a second core including a second metal powder and a second shell surrounding the second core, and wherein one or more of the first shell or the second shell include an organic material, and one or more of the first metal powder or the second metal powder include silver (Ag) or copper (Cu).

8. The display device of claim 6, wherein the first size of the first core-shell particle is smaller than 300 nanometers (nm), wherein the second size of the second core-shell particle is larger than 1 micrometer (μm).

9. The display device of claim 6, wherein a content in weight of the core-shell particles including the plurality of first core-shell particles and the plurality of second core-shell particles dispersed in the organic filler is in a range from 30% to 50%, inclusive.

10. The display device of claim 6, wherein a ratio between a content in weight of the plurality of first core-shell particles and a content in weight of the plurality of second core-shell particles in the organic filler is in a range from 2:6 to 4:8, inclusive.

11. The display device of claim 1, wherein the antistatic film has a surface resistance in a range from $10^0$ to $10^3 \Omega/\square$, inclusive.

12. A method for manufacturing a display device, the method comprising:

bonding a second substrate to a first surface of a first substrate, wherein a plurality of micro-LEDs are disposed on a second surface of the first substrate that is opposite to the first surface of the first substrate;

forming a side wiring disposed on a side surface of each of the first substrate and the second substrate, the side wiring electrically connecting the first substrate and the second substrate to each other;

forming a side surface sealing member covering the side wiring, wherein the side surface sealing member includes an organic filler and core-shell particles dispersed in the organic filler; and forming an antistatic film by cutting the side surface sealing member using a laser beam.

13. The method of claim 12, wherein the antistatic film is formed by repeatedly irradiating the laser beam onto the side surface sealing member to sinter a portion of the core-shell particles.

14. The method of claim 13, wherein the antistatic film formed by sintering the core-shell particles has a surface resistance in a range from $10^0$ to $10^3 \Omega/\square$, inclusive.

15. The method of claim 12, wherein the core-shell particles include a plurality of first core-shell particles and a plurality of second core-shell particles dispersed in the organic filler, wherein each of the plurality of first core-shell particles has a first size and each of the plurality of second core-shell particles has a second size larger than the first size.

16. The method of claim 15, wherein each of the plurality of first core-shell particles includes a first core including a first metal powder and a first shell surrounding the first core, wherein each of the plurality of second core-shell particles includes a second core including a second metal powder and a second shell surrounding the second core, wherein one or more of the first shell or the second shell include an organic material, and one or more of the first metal powder or the second metal powder include silver (Ag) or copper (Cu).

17. The method of claim 15, wherein a content in weight of the core-shell particles including the plurality of first core-shell particles and the plurality of second core-shell particles dispersed in the organic filler is in a range from 30% to 50%, inclusive.

18. The method of claim 15, wherein a ratio of a content in weight of the plurality of first core-shell particles and a content in weight of the plurality of second core-shell particles is in a range from 2:6 to 4:8, inclusive.

19. The method of claim 12, further comprising, after forming the side wiring and before forming the side surface sealing member, forming a wiring protective film covering the side wiring, the wiring protective film including black ink.

20. A display device comprising:
a first substrate;
a second substrate bonded to the first substrate;
a side wiring extending along side surfaces of the first substrate and the second;
a side surface sealing member on the side wiring, the side surface sealing member including an organic filler and core-shell particles of different sizes dispersed in the organic filler, the core-shell particles including metal powders; and
an antistatic film on an outer surface of the side surface sealing member, the antistatic film including metal in a sintered state that is the same metal as those in the side surface sealing member.

* * * * *